United States Patent [19]
Liu et al.

[11] Patent Number: 6,074,952
[45] Date of Patent: Jun. 13, 2000

[54] METHOD FOR FORMING MULTI-LEVEL CONTACTS

[75] Inventors: Hao-Chieh Liu, Taipei; Erik S. Jeng, Hsinchu; Bi-Ling Chen, Taipei; Wan-Yih Lien, Hsinchu, all of Taiwan

[73] Assignee: Vanguard International Semiconductor Corporation, Hsinchu, Taiwan

[21] Appl. No.: 09/074,341

[22] Filed: May 7, 1998

[51] Int. Cl.⁷ .................................................. H01L 21/306
[52] U.S. Cl. .......................... 438/706; 438/723; 438/724; 438/737; 438/743; 438/744
[58] Field of Search .................... 438/710, 712, 438/723, 724, 726, 732, 733, 743, 744, 970, 706, 737

[56] References Cited

U.S. PATENT DOCUMENTS

| | | | |
|---|---|---|---|
| 5,269,879 | 12/1993 | Rhoades et al. | 438/694 |
| 5,286,344 | 2/1994 | Blalock et al. | 438/723 |
| 5,366,590 | 11/1994 | Kadomura | 438/723 |
| 5,399,237 | 3/1995 | Keswick et al. | 216/68 |
| 5,843,847 | 12/1998 | Pu et al. | 438/723 |
| 5,874,013 | 2/1999 | Tokunaga et al. | 216/67 |
| 5,904,566 | 5/1999 | Tao et al. | 438/689 |

*Primary Examiner*—Benjamin L. Utech
*Assistant Examiner*—Donald L. Champagne
*Attorney, Agent, or Firm*—Christensen O'Connor Johnson Kindness PLLC

[57] ABSTRACT

A method of forming a plurality of contact holes 70 in a semiconductor wafer uses a single step. The semiconductor wafer includes a dielectric layer 69 overlying a silicon substrate 51, a silicon nitride layer 67a, and a silicon oxynitride layer 63c. First, a photoresist 68 layer is developed on the dielectric layer. Prior to forming the dielectric layer, the silicon oxynitride layer is formed overlying a first conductive layer, and the silicon nitride layer is formed overlying a second conductive layer. Second, an etching step is performed to etch through the silicon oxynitride layer, the silicon nitride layer, a portion of the dielectric layer above the silicon oxynitride layer, and the silicon nitride layer to expose the silicon substrate 51, the first conductive layer 63a, and the second conductive layer 67c. The etching recipe includes a first chemistry and a second chemistry. The first chemistry includes $C_2F_6$, $C_4F_8$, $CH_3F$, and Ar. The second chemistry is chosen from a group including $O_2$, $CO_2$, CO and any combination thereof. Thus, a plurality of contact holes is formed above the silicon substrate, the first conductive layer and the second conductive layer.

20 Claims, 2 Drawing Sheets

METHOD FOR FORMING MULTI-LEVEL CONTACTS

BACKGROUND OF THE INVENTION

1. Field of the Invention

This invention relates to a method for forming multi-level contacts, and especially relates to a method for forming multi-level contacts in large scale integration semiconductor devices.

2. Description of the Prior Art

With the advent of Ultra Large Scale Integrated (ULSI) DRAM devices, the size of the memory cells becomes smaller and smaller such that the area available for a single memory cell becomes very small. The manufacture of a DRAM memory cell includes the fabrication of a transistor, a capacitor and contacts to periphery circuits. To shrink the area of the devices in the DRAM cell is thus the most important issue for the designer of the DRAM cell. The stacked capacitor is widely used in DRAM memory cells of small size, because the stacked capacitor occupies relatively small area.

Additionally, as the step height of the stacked capacitor is large for the large-scale integration semiconductor device, multi-level contacts in the periphery circuit are widely used. Also, the self align contact technology must be used in fabricating ULSI devices. When there is no need to use the technology of self align contact, the spacer and the cap of the gate electrode can be formed of TEOS (Tetra Ethyl Ortho Silicate) oxide. As shown in FIG. 1, a plurality of multi-level contact holes is to be formed in the semiconductor device mentioned above.

A silicon substrate 9 is provided for the semiconductor device mentioned above. A plate poly layer 10 is connected to a capacitor 11 of the semiconductor device, and a bit line 13 includes a first tungsten silicide layer 13a and a first poly silicon layer 13b. A word line 17 includes an oxide cap 17a, an oxide spacer 17b, a second tungsten silicide layer 17c, and a second poly silicon layer 17d. The bit line 13 and the word line 17 are used to address a semiconductor device. The plurality of multi-level contact holes 18 is formed penetrating a BPSG layer 19, using a developed photoresist layer 20 as a mask. Because the integration of the semiconductor device mentioned above is not high, it is not necessary to utilize a self-aligned contact technology or an anti-reflection layer. Thus the multi-level contact holes can be formed in an etching step using a fluorine-containing gas as a etchant, such as $CCl_2F_2$ or $CF_4$.

When the large scale integration semiconductor device is to be fabricated, an anti-reflection layer must be used to increase the cell density and improve the photo proximity effect. Typically, an inorganic anti-reflection layer composed of silicon nitride ($Si_3N_4$) or silicon oxynitride (SiON) is used. In addition, the technology of self align contact is used to increase critical dimension (CD) control when fabricating the large scale integration semiconductor device. So the material used to form the spacer and the cap of the gate electrode is changed to silicon nitride ($Si_3N_4$).

The cross sectional view of the large scale integration semiconductor device is shown in FIG. 2. A silicon substrate 29 is provided for the large scale semiconductor device mentioned above. A plate poly layer 30 is connected to a capacitor 31 of the large scale integration semiconductor device, and a bit line 33 includes a first tungsten silicide layer 33a, a first poly silicon layer 33b, and a silicon oxynitride layer 33c. The silicon oxynitride layer 33c on the first tungsten silicide layer 33a is an anti-reflection layer. A word line 37 includes a silicon nitride layer 37a, a silicon nitride spacer 37b, a second tungsten silicide layer 37c, and a second polysilicon layer 37d. The bit line 33 and the word line 37 are used to address the large scale integration semiconductor device. Subsequently, to form multi-level contacts, a photoresist layer 38 is developed on a BPSG layer 39.

When the traditional fluorine containing gas is used to form the multi-level contact hole, it tends to result in either an etch-stop or/polymer regrowth on both the silicon nitride layer 37a and the silicon oxynitride layer 33c. In addition, silicon loss in the plate poly layer 30 and the silicon substrate 29 can be serious. As shown in FIG. 3, multi-level contact holes 40 are formed in the BPSG layer 39. But as mentioned above, when etching the silicon nitride layer 37a and the silicon oxynitride layer 33c, the etch-stop or the polymer regrowth problems can result. Thus the first tungsten silicide layer 33a and the second tungsten silicide layer 37c are not exposed after the etching step.

Moreover, there is a tendency to over etch the plate poly layer 30 and the silicon substrate 29 when the traditional fluorine-containing gas is used to form the multi-level contact hole to expose the first tungsten silicide layer 33a and the second tungsten silicide layer 37c. The cross sectional view of the semiconductor device processed with the etching step mentioned above is shown in FIG. 3, in which the semiconductor device is defective because of an open circuit or short circuit in the semiconductor device.

Because it is very difficult to use the traditional recipe to form multi-level contact holes of different depth, the yield of the semiconductor device of high integration is low. As the integration of semiconductor gets higher, the multi-level contact becomes more important, and the etching step becomes more critical.

SUMMARY OF THE INVENTION

To implement a large scale integration semiconductor device, a method forming a plurality of contact holes in a semiconductor wafer using self-aligned contact technology within an etching step is disclosed herein. The semiconductor wafer includes a dielectric layer overlying a silicon substrate, a silicon nitride layer, and a silicon oxynitride layer. The method includes the following steps. First, a photoresist layer is developed on the dielectric layer. Prior to forming the dielectric layer, the silicon oxynitride layer is formed overlying a first conductive layer, and the silicon nitride layer is formed overlying a second conductive layer.

Second, an etching step is performed to etch through the silicon oxynitride layer, the silicon nitride layer, a portion of the dielectric layer above the silicon oxynitride layer, and the silicon nitride layer to expose the silicon substrate, the first conductive layer, and the second conductive layer. The etching recipe includes a first chemistry and a second chemistry. The first chemistry includes $C_2F_6$, $C_4F_8$, $CH_3F$, and Ar. The second chemistry is chosen from a group including $O_2$, $CO_2$, CO, and any combination thereof. Thus a plurality of contact holes is formed above the silicon substrate, the first conductive layer, and the second conductive layer. The flow rate of the second chemistry is about 1–10 percent of that of the first chemistry.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Etch-stop or polymer regrowth can result on the silicon nitride layer 37a, and the silicon oxynitride layer 33c, when the traditional fluorine-containing gas is used to form the multi-level contact hole. Further more, there can be serious silicon loss in the plate poly layer 30 and the silicon substrate 29. So, as the integration of a semiconductor device increases, the traditional recipe used to form the multi-level contact hole can not meet the needs of the etching process. Thus the present invention provides a recipe to form the multi-level contact hole of different depth, and the yield of the semiconductor device can be greatly improved.

Figure 1:
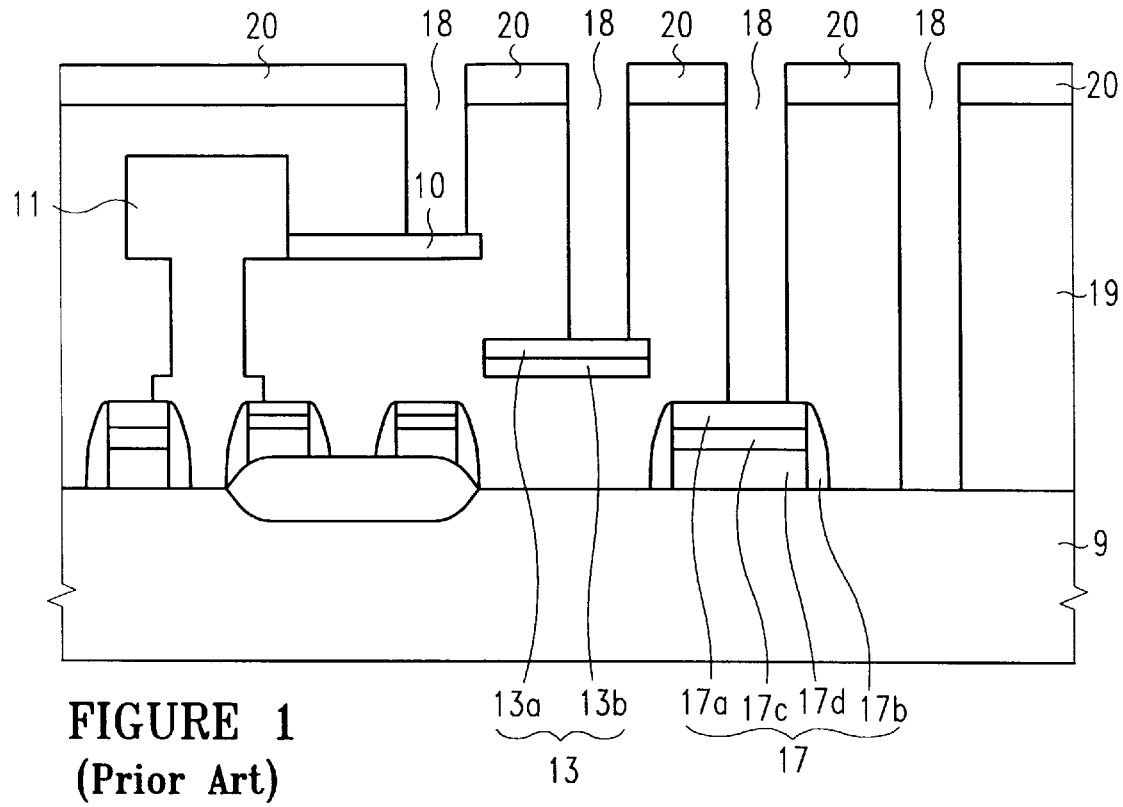
FIG. 1 illustrates the cross sectional view of a semiconductor device without self align contact technology.
Figure 2:
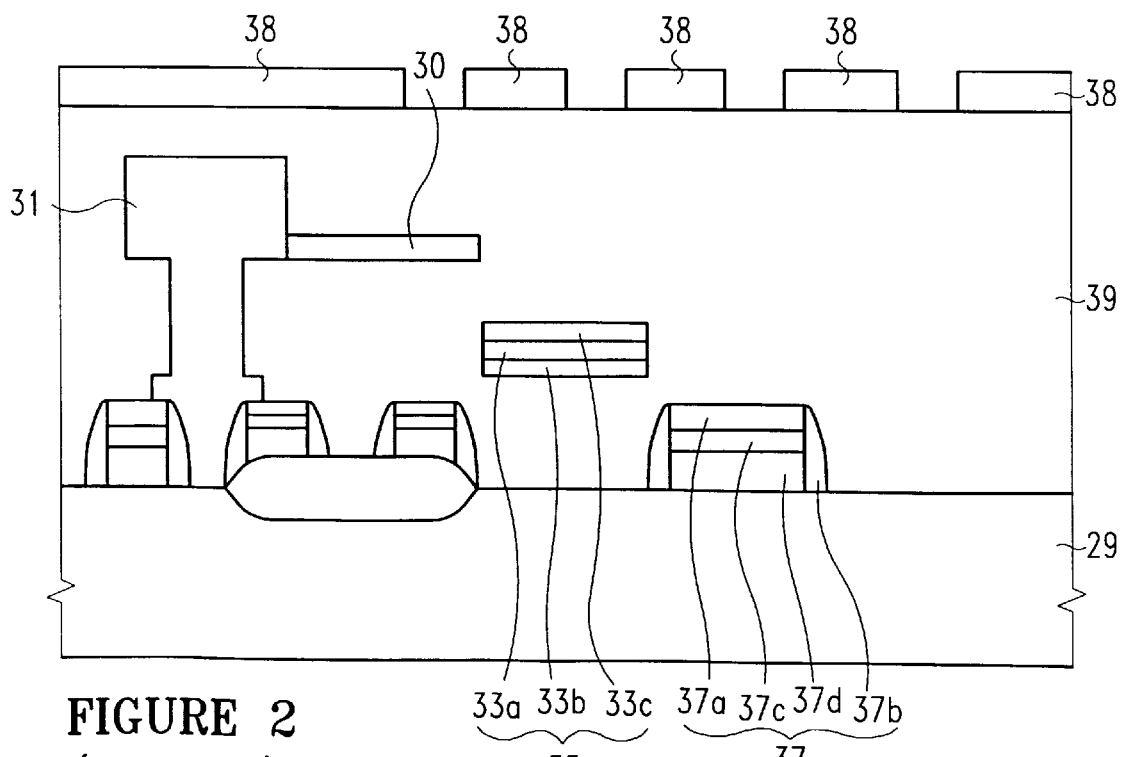
FIG. 2 illustrates the cross sectional view a large scale integration semiconductor device with self-aligned contact technology.
Figure 3:
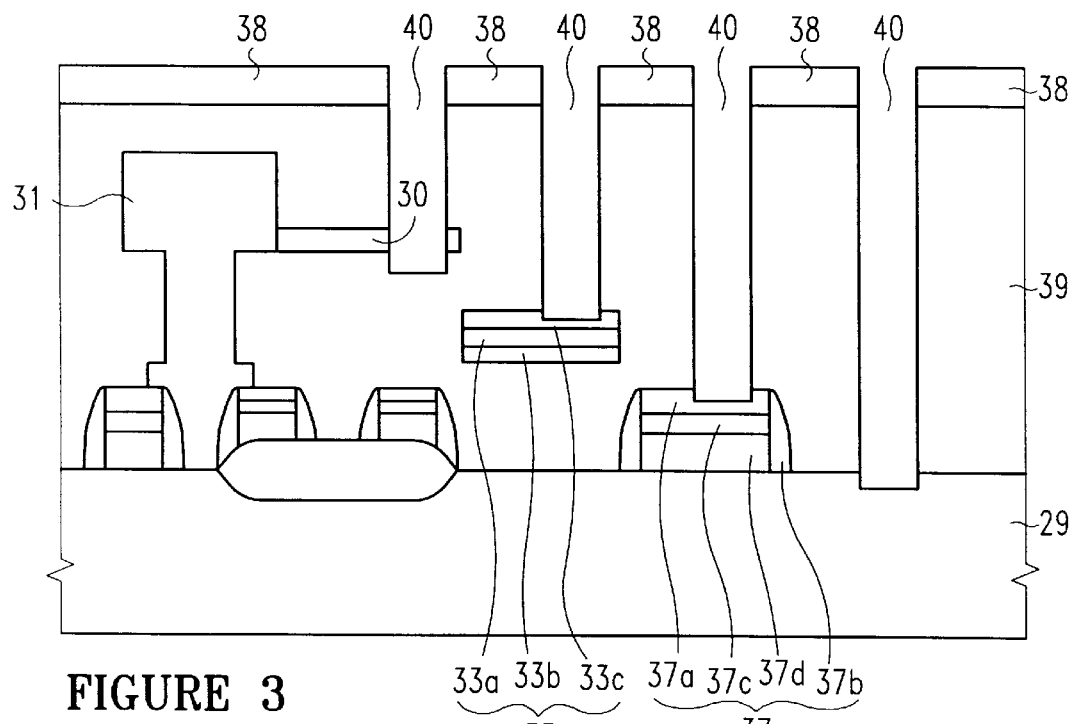
FIG. 3 illustrates the cross sectional view of a large scale integration semiconductor device using self-aligned contact technology with multi-level contact holes in the prior art.

To penetrate the silicon nitride layer 37a and the silicon oxynitride layer 33c (FIG. 3), and to prevent the over etching of the plate poly payer 30 and the silicon substrate 29 when forming the multi-level contact holes 40 in an etching step, the present invention provides a recipe. The recipe provided in the preferred embodiment of the present invention can produce a polymer on the surface when etching the polysilicon. Also, the recipe can etch through the silicon nitride layer 37a and the silicon oxynitride layer 33c without producing the etch-stop or the polymer regrowth when simultaneously etching the plate poly layer 30 and the silicon substrate 29.

Figure 4:
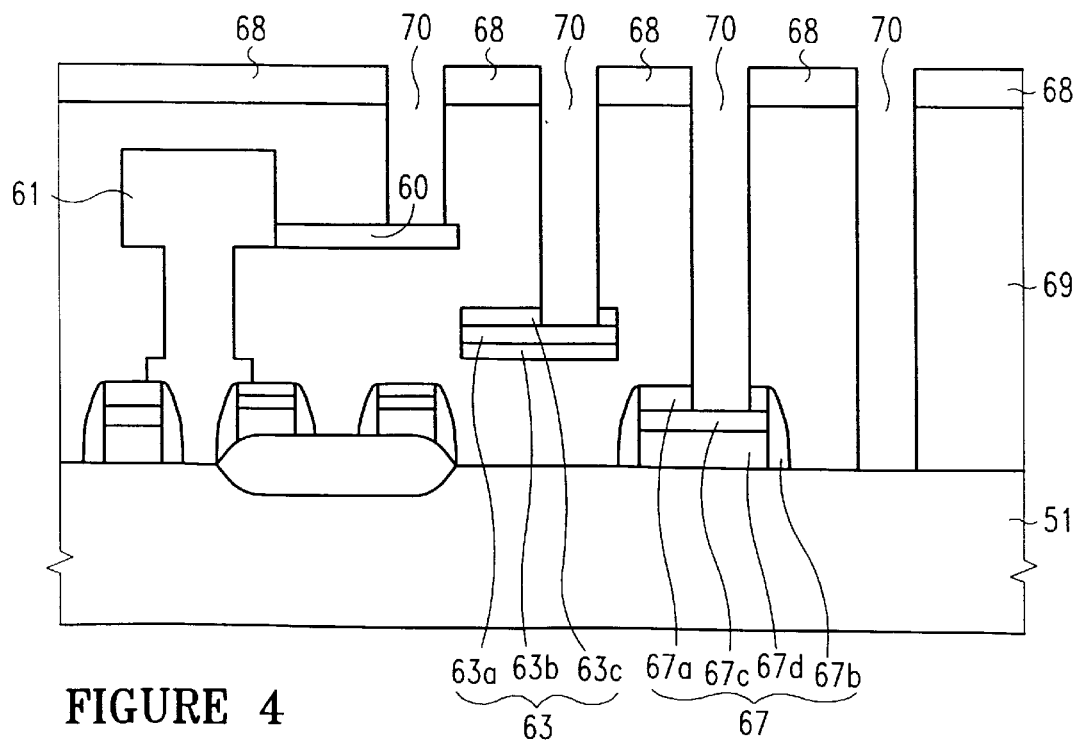
FIG. 4 illustrates the cross sectional view of a large scale integration semiconductor device using self-aligned contact technology with multi-level contact holes in the present invention.

To implement a large scale integration semiconductor device, an anti-reflection layer a self-aligned contact is utilized, and a multi-level contact is formed in the semiconductor device to implement the interconnection. Referring to FIG. 4, a silicon substrate 51 is provided for the large integration scale semiconductor device mentioned above. A plate poly layer 60 is connected to a capacitor 61 of the large scale integration semiconductor device, and a bit line 63 includes a first conductive layer 63a, a first polysilicon layer 63b, and a silicon oxynitride layer 63c. The first conductive layer 63a in the preferred embodiment of the present invention is formed of tungsten silicide. The silicon oxynitride layer 63c on the first conductive layer 63a is an anti-reflection layer.

A word line 67 includes a silicon nitride layer 67a, a nitride spacer 67b, a second conductive layer 67c, and a second polysilicon layer 67d. The second conductive layer 67c in the preferred embodiment of the present invention is formed of tungsten silicide. In addition, the first conduction layer 63a and the second conductive layer 67c can be chosen from the group consisting of: WSi, TiSi, CoSi. The bit line 63 and the word line 67 are used to address the large scale integration semiconductor device. Subsequently, to form multi-level contacts, a photoresist layer 68 is developed on a dielectric layer 69. The dielectric layer 69 is formed of BPSG. When the recipe according to the preferred embodiment is used to form multi-level contact holes 70, there is neither the etch-step nor polymer regrowth problem on the silicon nitride layer 67a and the silicon oxynitride layer 63c. Instead, the etching step using the recipe in the preferred embodiment of the present invention can penetrate the silicon nitride layer 67a and the silicon oxynitride layer 63c to expose the first conductive layer 63a and the second conductive layer 67c.

In addition, a polymer is produced when etching the silicon in the plate poly layer 60 and the silicon substrate 51. So there is no serious silicon overetching in the plate poly layer 60 and the silicon substrate 51. Thus, multi-level contact holes 70 of different depth are formed in the etching step. A cross sectional view of the resulting semiconductor wafer is shown in FIG. 4. To form the multi-level contact plug, the polymer in the multi-level contact holes 70 is removed in situ in another etching step, followed by filling polysilicon in the multi-level contact holes 70.

Because the polymer in the multi-level contact holes 70 acts as a mask when etching the polysilicon in the plate poly layer 60 and the silicon substrate 51, the over etching is prevented. The recipe used in the preferred embodiment according to the present invention includes a first chemistry including $C_2F_6$, $C_4F_8$, $CH_3F$ and Ar. In addition, the recipe used in the preferred embodiment of the present invention includes a second chemistry that is not used in the traditional recipe. The second chemistry includes $CO_2$, CO, $O_2$ or the combination thereof. The flow rate of $C_2F_6$, $C_4F_8$, $CH_3F$ and Ar are about 0–10 sccm, 13–25 sccm, 10–30 sccm, and 60–200 sccm respectively.

Particularly, the flow rate of the second chemistry is about 1–10 percent of that of the first chemistry. The recipe in the present invention can prevent etch-stop on the silicon nitride layer or the silicon oxynitride layer while maintaining high selectivity to the underlying conductive layers, such as silicon substrate, doped polycrystalline silicon, and material silicide. The power used to process the recipe is about 1600–2400 Watts in source power, and about 1000–1500 Watts in bias power. Thus the multi-level contacts can be formed in the large scale integration semiconductor device without etch-stop on the silicon nitride layer or the silicon oxynitride layer while maintaining high selectivity to silicon substrate, doped polycrystalline silicon, or material silicide.

Although specific embodiments have been illustrated and described it will be obvious to those skilled in the art that various modification may be made without departing from the spirit which is intended to be limited solely by the appended claims.

What is claimed is:

1. A method for forming a plurality of contact holes in a semiconductor wafer using a single etching step, said semiconductor wafer comprising a dielectric layer overlying a silicon substrate, a silicon nitride layer, and a silicon oxynitride layer, said silicon oxynitride layer overlying a first conductive layer and said silicon nitride layer overlying a second conductive layer, said method comprising:

developing a photoresist layer on said dielectric layer defining said plurality of contact holes; and etching through a portion of said dielectric layer and through said silicon oxynitride layer, and etching through a portion of said dielectric layer and through said silicon nitride layer using a recipe to expose said silicon substrate, said first conductive layer, and said second conductive layer, said recipe consisting a first chemistry and a second chemistry, said first chemistry chosen from the group consisting of $C_2F_6$, $C_4F_8$, $CH_3F$, and Ar, said second chemistry being chosen from the group consisting of $O_2$, $CO_2$, CO, and any combination thereof, said etching forming said plurality of contact holes above said silicon substrate, said first conductive layer, and said second conductive layer.

2. The method of claim 1, wherein said first conductive layer and said second conductive layer are formed of a silicide.

3. The method of claim 2, wherein said silicide is chosen from the group consisting of: WSi, TiSi, CoSi.

4. The method of claim 1, wherein a flow rate of said $C_2F_6$ is about 0–10 sccm, a flow rate of said $C_4F_8$ is about 13–25 sccm, a flow rate of said $CH_3F$ is about 10–30 sccm, and a flow rate of said Ar is about 60–200 sccm.

5. The method of claim 1, wherein said second chemistry has a flow rate of about 1–10 percent of that of said first chemistry.

6. The method of claim 1, wherein a depth of said contact hole above said exposed silicon substrate, a depth of said contact hole above said exposed silicon oxynitride layer, and a depth of said contact hole above said exposed silicon nitride layer are all mutually different.

7. A method for forming a plurality of contact holes in a semiconductor wafer using a self-aligned contact technology, said semiconductor wafer comprising a dielectric layer overlying a silicon substrate, a silicon nitride layer, a silicon oxynitride layer, and a polysilicon layer, said silicon oxynitride layer overlying a first conductive layer and said silicon nitride layer overlying a second conductive layer, said method comprising:

developing a photoresist layer on said dielectric layer defining said plurality of contact holes; and etching through a portion of said dielectric layer and through said silicon oxynitride layer, and etching through a portion of said dielectric layer and through said silicon nitride layer, and a portion of said dielectric layer above said silicon oxynitride layer using a recipe to expose said silicon substrate, said first conductive layer, said second conductive layer, and said polysilicon layer, said recipe consisting a first chemistry and a second chemistry, said first chemistry being chosen from the group consisting of $C_2F_6$, $C_4F_8$, $CH_3F$, and Ar, said second chemistry being chosen from the group consisting of $O_2$, $CO_2$, CO, and any combination thereof, said etching forming said plurality of contact holes above said silicon substrate, said first conductive layer, said second conductive layer and said polysilicon layer.

8. The method of claim 7, wherein said first conductive layer and said second conductive layer are formed of silicide.

9. The method of claim 8, wherein said silicide is chosen from the group consisting of: WSi, TiSi, CoSi.

10. The method of claim 7, wherein a flow rate of said $C_2F_6$ is about 0–10 sccm, a flow rate of said $C_4F_8$ is about 13–25 sccm, a flow rate of said $CH_3F$ is about 10–30 sccm, and a flow rate of said Ar is about 60–200 sccm.

11. The method of claim 10, wherein a flow rate of said second chemistry ranges between one and ten percent of said first chemistry.

12. The method of claim 7, wherein a depth of said contact hole above said exposed polysilicon layer, a depth of said contact hole above said exposed silicon substrate, a depth of said contact hole above said exposed silicon oxynitride layer, and a depth of said contact hole above said exposed silicon nitride layer are all mutually different.

13. A method for forming a plurality of contact holes in a semiconductor wafer using a self align technology, said semiconductor wafer comprising a dielectric layer overlying a silicon substrate, a bit line, a word line, and a plate polysilicon layer, said bit line comprising a first oxynitride layer on a first silicide layer, said first silicide layer on a first polysilicon layer, said word line comprising a silicon nitride layer on a second silicide layer, said second silicide layer on a gate polysilicon layer, a nitride spacer being formed at both sides of said word line, said method comprising:

developing a photoresist layer on said dielectric layer defining said plurality of contact holes; and etching through a portion of said dielectric layer and through said silicon oxynitride layer, and etching through a portion of said dielectric layer and through said silicon nitride layer using a recipe to expose said silicon substrate, said first silicide layer, and said second silicide layer, and said gate polysilicon layer, said recipe consisting a first chemistry and a second chemistry, said first chemistry being chosen from the group consisting of $C_2F_6$, $C_4F_8$, $CH_3F$, and Ar, said second chemistry being chosen from the group consisting of $O_2$, $CO_2$, CO, and any combination thereof, said etching forming said plurality of contact holes above said silicon substrate, said first silicide layer, said second silicide layer and said plate polysilicon layer.

14. The method of claim 13, wherein said first silicide layer and said second silicide layer are chosen from the group consisting of: WSi, TiSi, CoSi.

15. The method of claim 13, wherein a flow rate of said $C_2F_6$ is about 0–10 sccm, a flow rate of said $C_4F_8$ is about 13–25 sccm, a flow rate of said $CH_3F$ is about 10–30 sccm, and a flow rate of said Ar is about 60–200 sccm.

16. The method of claim 13, wherein a flow rate of said second chemistry is about 1–10 percent of that of said first chemistry.

17. A method of forming a plurality of contact holes in a single etching step, the method comprising:

providing a silicon substrate having formed thereon a first address line, a second address line and a dielectric layer covering said first and second address lines, wherein said first address line has an oxynitride layer overlying a first silicide layer and said second address line has a silicon nitride layer overlying a second silicide layer;

forming an etching mask on said dielectric layer defining said plurality of contact holes; and performing an etching step with a first chemistry and a second chemistry, said first chemistry comprising $C_2F_6$, $C_4F_8$, $CH_3F$ and Ar and said second chemistry comprising $O_2$, whereby portions of said dielectric, oxynitride and silicon nitride layers are removed to form said plurality of contact holes exposing portions of said first and second silicide layers, said first and second chemistries not including CO or $CO_2$.

18. The method of claim 17, wherein said plurality of contact holes includes a contact hole for contacting a portion of said silicon substrate, said etching step forming a polymer over said portion of said silicon substrate.

19. The method of claim 17, wherein said plurality of contact holes includes a contact hole for contacting a polysilicon plate formed above said silicon substrate, said etching step forming a polymer over said polysilicon plate.

20. The method of claim 18, wherein a flow rate of said $C_2F_6$ is about 0–10 sccm, a flow rate of said $C_4F_8$ is about 13–25 sccm, a flow rate of said $CH_3F$ is about 10–30 sccm, and a flow rate of said Ar is about 60–200 sccm.

* * * * *